United States Patent
Kikuchi

(10) Patent No.: US 10,018,680 B2
(45) Date of Patent: Jul. 10, 2018

(54) SEMICONDUCTOR DEVICE, BATTERY MONITORING SYSTEM, AND METHOD FOR ACTIVATING SEMICONDUCTOR DEVICE

(71) Applicant: LAPIS SEMICONDUCTOR CO., LTD., Kanagawa (JP)

(72) Inventor: Hidekazu Kikuchi, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 225 days.

(21) Appl. No.: 14/824,118

(22) Filed: Aug. 12, 2015

(65) Prior Publication Data

US 2016/0061905 A1    Mar. 3, 2016

(30) Foreign Application Priority Data

Aug. 27, 2014 (JP) .................................. 2014-173206

(51) Int. Cl.
    *G01R 31/36* (2006.01)
    *H03K 17/687* (2006.01)
    (Continued)

(52) U.S. Cl.
    CPC ....... *G01R 31/3658* (2013.01); *H03K 17/687* (2013.01); *H03K 19/017509* (2013.01);
    (Continued)

(58) Field of Classification Search
    CPC ....... G01R 31/3658; H03K 19/018528; H03K 19/018521; H03K 19/017509; H03K 17/687
    (Continued)

(56) References Cited

U.S. PATENT DOCUMENTS 5,592,421 A * 1/1997 Kaneko .................. G11C 5/147
                                                  365/189.09
5,923,064 A * 7/1999 Abe ...................... H01L 27/105
                                                  257/327
(Continued)

FOREIGN PATENT DOCUMENTS

JP        S59201525 A      11/1984
JP        2010-146991 A     7/2010
(Continued)

OTHER PUBLICATIONS

"What is the purpose of "MOSFET driver" IC's", Kevin Vermeer, StackExchange, Published Online Jul. 8, 2010, Accessed Jun. 20, 2017, electronics.stackexchange.com/questions/3348/what-is-the-purpose-of-mosfet-driver-ics.*

(Continued)

*Primary Examiner* — Robert Grant
*Assistant Examiner* — John Trischler
(74) *Attorney, Agent, or Firm* — Volentine, Whitt and Francos, PLLC

(57) ABSTRACT

A semiconductor device, a battery monitoring system, and a method for activating the semiconductor device that may reduce current consumption in standby state. An integrated circuit (IC) of the semiconductor device includes an activation circuit that uses a ground of the IC as ground and a power source voltage of the IC as its power source, and a driving circuit that uses the power source voltage as ground and a boosted voltage output from a boosting circuit as its power source. In the IC, only the activation circuit enters an operation state in a standby state, and when recovered from the standby state, causes the activation circuit to make inner circuits of the IC enter the operation state based on an activation signal. When all the inner circuits enter the (Continued)

operation state, the driving circuit outputs the activation signal to the activation circuit of an upper IC.

12 Claims, 9 Drawing Sheets

(51) Int. Cl.
  *H03K 19/0175* (2006.01)
  *H03K 19/0185* (2006.01)
(52) U.S. Cl.
  CPC ............. *H03K 19/018521* (2013.01); *H03K 19/018528* (2013.01)
(58) Field of Classification Search
  USPC .......................................................... 324/434
  See application file for complete search history.

(56) References Cited

U.S. PATENT DOCUMENTS

| | | | | |
|---|---|---|---|---|
| 6,525,567 | B2* | 2/2003 | Koizumi | G09G 3/3674 326/82 |
| 7,471,065 | B2* | 12/2008 | Emori | B60L 11/1855 320/116 |
| 7,911,244 | B2* | 3/2011 | Kikuchi | H03F 3/45197 327/108 |
| 8,159,184 | B2* | 4/2012 | Emori | B60L 3/0046 307/10.1 |
| 8,928,513 | B1* | 1/2015 | Waltari | H03M 1/66 341/136 |
| 9,209,632 | B2* | 12/2015 | Kadirvel, III | H02J 7/0031 |
| 9,231,419 | B2* | 1/2016 | Kato | H02J 7/0031 |
| 9,269,991 | B2* | 2/2016 | Takeshita | H01M 10/4207 |
| 9,356,453 | B2* | 5/2016 | Kudo | H02J 7/0014 |
| 9,746,525 | B2 | 8/2017 | Kudo et al. | |
| 2001/0048322 | A1* | 12/2001 | Koizumi | G09G 3/3674 326/81 |
| 2008/0224632 | A1* | 9/2008 | Noda | H05B 33/0812 315/291 |
| 2009/0085516 | A1* | 4/2009 | Emori | B60L 3/0046 320/118 |
| 2009/0140778 | A1* | 6/2009 | Kikuchi | H03F 3/45197 327/108 |
| 2010/0209748 | A1* | 8/2010 | Kudo | H01M 10/425 429/91 |
| 2011/0254508 | A1* | 10/2011 | Sakakibara | H01M 10/441 320/118 |
| 2011/0316520 | A1* | 12/2011 | Kawahara | B60L 3/0046 323/351 |
| 2012/0062187 | A1* | 3/2012 | Shim | H02J 7/0016 320/167 |
| 2014/0018990 | A1* | 1/2014 | Kataoka | B60L 11/1851 701/22 |
| 2014/0029147 | A1* | 1/2014 | Kadirvel, III | H02J 7/0031 361/90 |
| 2014/0191765 | A1* | 7/2014 | Takeshita | H01M 10/4207 324/434 |
| 2014/0203762 | A1* | 7/2014 | Kato | H02J 7/0031 320/107 |
| 2014/0312913 | A1* | 10/2014 | Kikuchi | H01M 10/482 324/426 |
| 2015/0155722 | A1* | 6/2015 | Kudo | H02J 7/0014 320/116 |
| 2016/0079789 | A1* | 3/2016 | Kato | H02J 7/0031 320/162 |
| 2016/0105173 | A1* | 4/2016 | De Rooij | H03K 17/6871 327/109 |
| 2016/0118894 | A1* | 4/2016 | Zhang | H02M 3/158 323/271 |
| 2016/0164319 | A1* | 6/2016 | Kadirvel | H02J 7/0031 320/134 |
| 2016/0241056 | A1* | 8/2016 | Kudo | H02J 7/0014 |
| 2016/0261127 | A1* | 9/2016 | Worry | G01R 31/3624 |

FOREIGN PATENT DOCUMENTS

| | | |
|---|---|---|
| JP | 2012-044768 A | 3/2012 |
| JP | 2014134454 A | 7/2014 |
| WO | 2013035183 A1 | 3/2013 |

OTHER PUBLICATIONS

Japanese Office Action dated Jan. 30, 2018.

* cited by examiner

| (G) | (H) | (I) |
|---|---|---|
| 0 | 0 | 0 |
| 0 | 1 | 0 |
| 1 | 0 | 1 |
| 1 | 1 | 0 |

SEMICONDUCTOR DEVICE, BATTERY MONITORING SYSTEM, AND METHOD FOR ACTIVATING SEMICONDUCTOR DEVICE

CROSS-REFERENCE TO RELATED APPLICATION

This application claims priority under 35 USC 119 from Japanese Patent Application No. 2014-173206, filed on Aug. 27, 2014, the disclosure of which is incorporated by reference herein.

BACKGROUND OF THE INVENTION

Field of the Invention

The present invention relates to a semiconductor device, a battery monitoring system, and a method for activating the semiconductor device.

Description of the Related Art

Conventionally, plural semiconductor devices that are connected in series and that communicates with each other, so-called daisy-chain connected semiconductor devices, are known. In a case in which such plural semiconductor devices are activated, and particularly in a case in which the state of the semiconductor devices are recovered from a standby state in a power down mode, the activation is sequentially performed from the lowest semiconductor device to the upper semiconductor device. Therefore, in the conventional semiconductor device, a regulator and a communication circuit that performs the communication between the semiconductor devices are set to be in the operation state during the standby state, so as to enable the communication between the semiconductor devices at any time (for example, see Japanese Patent Application Laid-Open (JP-A) No. 2012-044768 and JP-A No. 2010-146991).

However, in the conventional semiconductor device, current consumption may not be sufficiently reduced, due to the operation of the regulator and the operation between the semiconductor devices during the standby state.

SUMMARY OF THE INVENTION

The invention provides a semiconductor device, a battery monitoring system, and a method for activating the semiconductor device, which may reduce current consumption in a standby state.

A first aspect is a semiconductor device including: an activation circuit, to which an activation signal output from an outside of the semiconductor device is input, that operates at an operation voltage within a range that is equal to or more than a ground potential of a connected external battery and is equal to or lower than a power source potential of the battery, and that outputs an inner activation signal based on the activation signal; a regulator, to which the inner activation signal is input, that generates and outputs a driving voltage from the power source potential; a boosting circuit that generates and outputs a boosted voltage that is equal to or more than the driving voltage; a driving circuit that operates at an operation voltage within a range that is equal to or more than the power source potential and is equal to or lower than a potential of the boosted voltage, and that outputs the activation signal to another semiconductor device according to the inner activation signal; a first communication circuit, to which a first communication signal output from the outside is input, that operates at an operation voltage within a range that is equal to or more than the ground potential and is equal to or lower than a potential of the driving voltage, and that outputs an inner communication signal based on the first communication signal; and a second communication circuit, to which the inner communication signal is input, that operates at an operation voltage within a range that is equal to or more than the power source potential and is equal to or lower than a potential of a driving voltage of the other semiconductor device, and that outputs a second communication signal based on the inner communication signal to the other semiconductor device.

A second aspect is a battery monitoring system including: a battery including a plurality of battery cells connected in series; a plurality of the semiconductor devices according to the first aspect, wherein the semiconductor devices are supplied with a highest potential of the battery as the power source potential, are supplied with a lowest potential of the battery as the ground potential, and the first communication circuit and the second communication circuit are connected between the semiconductor devices; and a control section that controls the plurality of semiconductor devices and is connected to any one of the plurality of semiconductor devices.

A third aspect is a method for activating a semiconductor device, the semiconductor device including, a regulator, to which an inner activation signal is input, that generates and outputs a driving voltage from a power source potential of an external battery, a boosting circuit that generates and outputs a boosted voltage that is equal to or more than the driving voltage, a first communication circuit, to which a first communication signal output from an outside of the semiconductor device is input, that operates at an operation voltage within a range that is equal to or more than a ground potential of the battery and is equal to or lower than a potential of the driving voltage, and that outputs an inner communication signal based on the first communication signal, and a second communication circuit, to which the inner communication signal is input, that operates at an operation voltage within a range that is equal to or more than the power source potential and is equal to or lower than a potential of a driving voltage of another semiconductor device, and that outputs a second communication signal based on the inner communication signal to the other semiconductor device, the method including: outputting the inner activation signal based on an activation signal by an activation circuit, to which an activation signal output from the outside of the semiconductor device is input, that operates at the operation voltage within a range that is equal to or more than the ground potential of the connected external battery and is equal to or lower than the power source potential of the battery; outputting an activation signal to the other semiconductor device according to the inner activation signal by a driving circuit that operates at an operation voltage within a range that is equal to or more than the power source potential and is equal to or lower than a potential of the boosted voltage.

According to the above aspects, the present invention may reduce current consumption in a standby state.

BRIEF DESCRIPTION OF THE DRAWINGS

Exemplary embodiments of the present invention will be described in detail based on the following figures, wherein.

DETAILED DESCRIPTION OF THE INVENTION

Hereinafter, a battery monitoring system including an integrated circuit (IC) for monitoring a battery as an example of a semiconductor device according to the present invention will be described with reference to the drawings.

First Exemplary Embodiment

Figure 1:
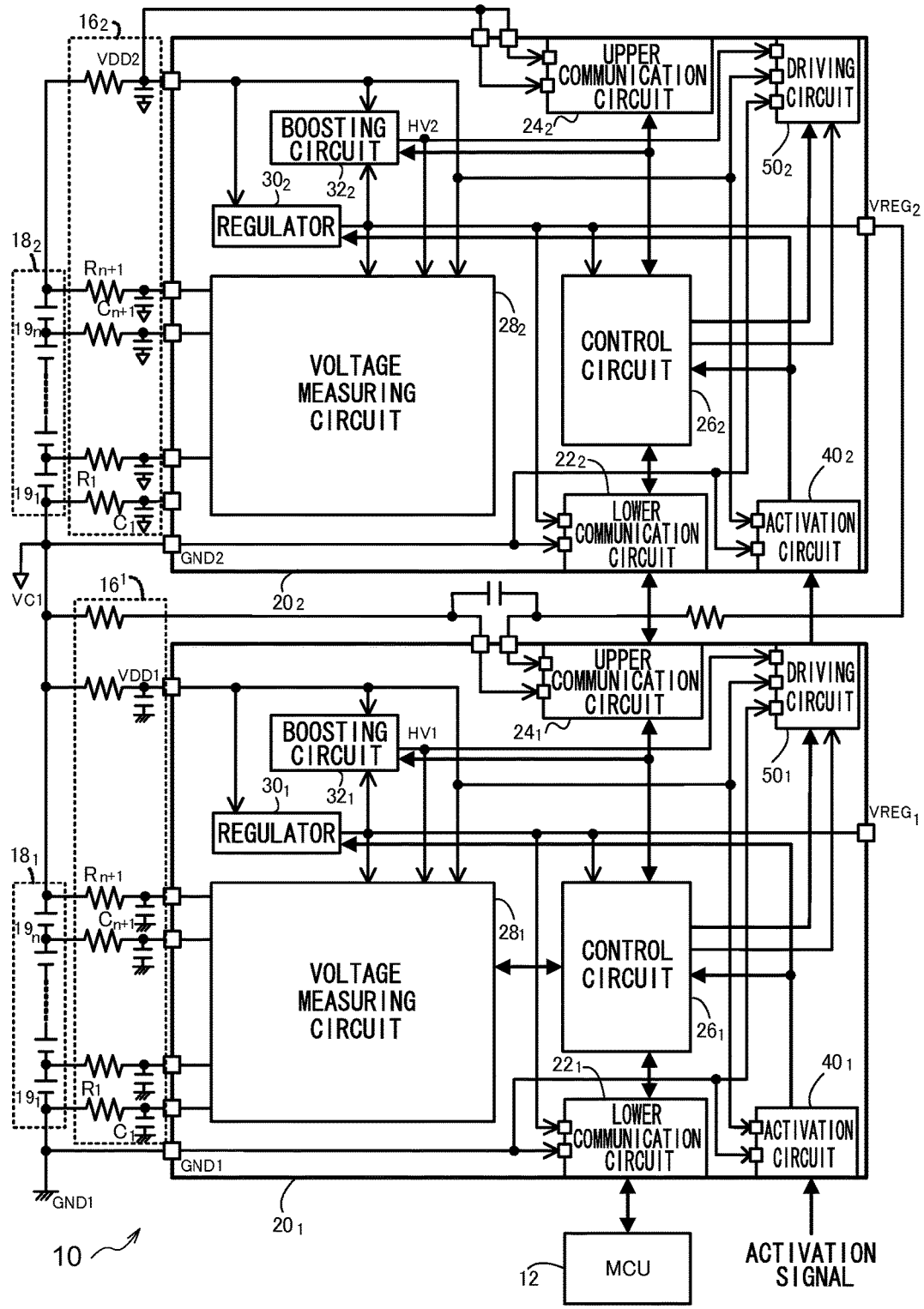
FIG. 1 is a schematic diagram illustrating a configuration of a battery monitoring system of a first exemplary embodiment.

First, a schematic configuration of the entire battery monitoring system of the exemplary embodiment will be described. FIG. 1 schematically illustrates a configuration of the battery monitoring system of the present exemplary embodiment.

A battery monitoring system 10 includes a micro controller unit (MCU) 12, two batteries 18 ($18_1$ and $18_2$), and two ICs 20 (an IC $20_1$ and an IC $20_2$). In the following, the batteries $18_1$ and $18_2$, the IC $20_1$, and the IC $20_2$ will be referred to as the "battery 18" and the "IC 20" when being referred collectively, and will be provided with respective code when being referred respectively.

The battery 18 includes n battery cells 19 (n is a natural number of 1 or more, and $19_1$ to $19n$ will be referred to as the "battery cell 19" when being referred collectively). The number of battery cells 19 included in each battery 18 is arbitrary. As a specific example, in the present exemplary embodiment, a case in which all of the batteries 18 each include n battery cells 19 are described. However, the present invention is not limited thereto. For example, the number of battery cells 19 may be different according to each battery 18. The battery cells 19 included in each battery 18 are connected in series. A specific example of the battery cell 19 includes a lithium-ion secondary battery cell.

The MCU 12 measures a voltage (battery voltage) of the battery cell 19 of the battery 18 using each IC 20 by controlling the entire battery monitoring system 10. As illustrated, in a case in which the voltage VDD of the battery 18 is used as a power source voltage, and the ICs 20 are daisy-chain connected, the upper IC 20 has a higher power source voltage. Accordingly, a group of ICs 20 is accessed from the lowest IC 20. Namely, the MCU 12 is connected to a lower communication circuit $22_1$ of the lowest IC 20 (the IC $20_1$) through a communication line, and communicates with the lowest IC 20 (the IC $20_1$).

The IC 20 measures a voltage of the battery cell 19 included in the battery 18. In the battery monitoring system 10 of the present exemplary embodiment, as illustrated in FIG. 1, each IC 20 is connected in series such that the IC $20_1$ is at the lowest stage and the IC $20_2$ is at the uppermost stage, and is daisy-chain connected. In the battery monitoring system 10 of the present exemplary embodiment, the description will be given as a specific example for a case in which two ICs 20 are provided. However, the number of ICs 20 is arbitrary, and not limited to two.

The IC 20 is supplied with the power source voltage VDD (VDD1 and VDD2, and referred to as "VDD" when being referred collectively) from the highest potential side of the battery 18. The ground GND (GND1 and GND2, and referred to as "GND" when being referred collectively) is supplied from the lowest potential of the battery 18. In the battery 18 of the present exemplary embodiment, since n battery cells 19 are connected in series, the power source voltages VDD1 and VDD2 may be expressed as the following Formulas (1) and (2) (where, V denotes the voltage of each battery cell 19). Generally, the power source voltage VDD is a high voltage and is about several tens of volts.

$$VDD1 = (V \times n) \times (\text{Stage number} = 1) \quad (1)$$

$$VDD2 = (V \times n) \times (\text{Stage number} = 2) \quad (2)$$

In the battery monitoring system 10 of the present exemplary embodiment, the potential of the ground GND1 of the lowest IC $20_1$ is the same as the lowest potential of the battery $18_1$. On the other hand, the potential of the ground GND2 of the IC $20_2$ is the same as the lowest potential of the battery $18_2$, and is the highest potential of the battery $18_1$ at the lower stage.

The IC 20 of the present exemplary embodiment includes the lower communication circuit 22 ($22_1$ and $22_2$), an upper communication circuit 24 ($24_1$ and $24_2$), a control circuit 26 ($26_1$ and $26_2$), a voltage measuring circuit 28 ($28_1$ and $28_2$), a regulator 30 ($30_1$ and $30_2$), a boosting circuit 32 ($32_1$ and $32_2$), an activation circuit 40 ($40_1$ and $40_2$), and a driving circuit 50 ($50_1$ and $50_2$). In the following, similar to the case as in the IC 20, the "lower communication circuit 22", the "upper communication circuit 24", the "control circuit 26", the "voltage measuring circuit 28", the "regulator 30", the "boosting circuit 32", "the activation circuit 40", and "the driving circuit 50" would be used when being referred collectively, and the respective references are used when being referred separately.

The control circuit 26 controls the entire IC 20. The control circuit 26 of the present exemplary embodiment outputs a control signal to the driving circuit 50 in a case in which predetermined inner circuits are activated. Examples of such predetermined inner circuits include the control circuit 26, the regulator 30, and the boosting circuit 32. However, the present invention is not limited thereto. Any inner circuits may be employed as the predetermined inner circuits as long as it supplies power necessary for the operation of the driving circuit 50. Another example of such predetermined inner circuits includes the entire inner circuits of the IC 20.

The voltage measuring circuit 28 is connected to the battery 18 via a filter 16, and measures a voltage of each battery cell 19 included in the connected battery 18. The filter 16 includes a resistive element R and a capacitive element C and has a function of suppressing an influence of noises on a signal flowing in the line of the power source voltage.

Examples of the voltage measuring circuit 28 include switching elements according to the number of battery cells 19 included in the battery 18. In such case, the voltage measuring circuit 28 selects a battery voltage line connected on the high potential side of the battery cell 19, which is a voltage measuring target, and a battery voltage line connected on the low potential side thereof using the switching element. Under the control of the control circuit 26, the voltage measuring circuit 28 measures the voltage of the measuring target battery cell 19 based on the potential of the battery voltage line connected on the high potential side and the potential of the battery voltage line connected on the low potential side. The measuring result of the voltage measuring circuit 28 is output to the MCU 12. Namely, the measuring result of the IC $20_2$ is output to the MCU 12 through the IC $20_1$.

The regulator 30 generates a driving voltage VREG (VREG1 or VREG2, referred to as "VREG" when being referred collectively) from the power source voltage VDD, which is high voltage supplied from the battery 18, and supplies the driving voltage VREG to the inner circuits of the IC 20 as a driving voltage thereof. Note that, the voltage of the driving voltage VREG is less than the power source voltage VDD.

As described above, since the power source voltage VDD is high voltage, the elements included in the circuits (the inner circuits of the IC) needs to be resistant to high voltage (high-voltage elements). However, if high-voltage elements are used for all elements in the circuits, area of the circuits may increase. For this reason, in the IC 20 of the present exemplary embodiment, high-voltage elements (the high voltage circuits) are used for a circuit area (circuit elements) where the voltage (the power source voltage VDD) of the battery cell 19 is applied, and low-voltage elements (low voltage circuits) are used for the other inner circuits that are driven by the driving voltage VREG output from the regulator 30. Namely, in the IC 20 illustrated in FIG. 1, the voltage measuring circuit 28, the regulator 30, and the boosting circuit 32 are the high voltage circuits, and the other circuits driven by the driving voltage VREG are the low voltage circuits.

The boosting circuit 32 generates a boosted voltage HV (HV1 or HV2, referred to as "HV" when being referred collectively) from of the power source voltage VDD supplied from the battery 18 and supplies the generated bossing voltage.

The lower communication circuit 22, which is an example of a first communication circuit, and the upper communication circuit 24, which is an example of a second communication circuit, communicates between the MCU 12 and the respective ICs 20.

The MCU 12 is connected to the lower communication circuit $22_1$ of the IC $20_1$ via the communication line, and transmits or receives various types of data with respect to the MCU 12. The upper communication circuit $24_1$ of the IC $20_1$ and the lower communication circuit $22_2$ of the IC $20_2$ are connected through the communication line, and transmit or receive various types of data between the IC $20_1$ and the IC $20_2$. The upper IC is not connected to the upper communication circuit $24_2$ of the IC $20_{2h}$. However, in a case in which the battery monitoring system 10 includes three or more ICs 20 (the case of a daisy-chain connection at three or more stages), the upper communication circuit $24_2$ of the IC $20_{2h}$ is connected to the lower communication circuit 22 of the upper IC through the communication line.

The lower communication circuit 22 uses the GND of the IC 20 as the GND of the circuit, and uses the driving voltage VREG output from the regulator 30 inside the IC 20 as a power source (a driving power source). Therefore, a signal input to and output from the lower communication circuit 22 is a low voltage signal having a potential level (amplitude) within a range that is equal to or more than the GND potential and is equal to or lower than the VREG potential. The upper communication circuit 24 uses the power source voltage VDD of the IC 20 as the GND of the circuit, and uses the driving voltage VREG output from the regulator 30 of the upper IC 20 as a power source (a driving power source). Therefore, a signal input to and output from the upper communication circuit 24 is a high voltage signal having a potential level within a range that is equal to or more than the VDD potential and is equal to or lower than the VDD+ the VREG potential of the upper IC 20.

The low voltage signal which is input to and output from the lower communication circuit 22 of the IC 20, and the high voltage signal which is input to and output from the upper communication circuit 24 are input/output between the lower communication circuit 22 and the upper communication circuit 24 using a level shifter (not illustrated) that shifts the level while keeping the amplitude at the same level.

Namely, in the present exemplary embodiment, the upper communication circuit $24_1$ of the $IC_1$ uses the power source voltage VDD1 of the IC $20_1$ as the GND, and uses the driving voltage VREG2 of the upper IC $20_2$ as the power source. The driving voltage VREG2 can be considered as a potential obtained by adding the power source voltage VDD1 of the IC $20_1$ and the driving voltage VREG1. The lower communication circuit $22_2$ of the IC $20_2$ uses the GND2 of the IC $20_2$ as the GND, and uses the driving voltage VREG2 output from the regulator $30_2$ inside the IC $20_2$ as power source (the driving power source). The GND2 of the IC $20_2$ can be considered as the same potential as that of the power source voltage VDD1 of the lower IC $20_1$. Therefore, the upper communication circuits $24_1$ of the IC $20_1$ and the lower communication circuit $22_2$ of the IC $20_2$ both use the driving voltage VREG2 of the IC $20_2$ as the power source, and the GND of the IC $20_2$ as the GND, and thus, a communication can be made with each other.

The activation circuit 40 of the present exemplary embodiment activates the inner circuits of the IC 20 based on an activation signal (for example, a recovery from a standby state). The activation circuit 40 of the present exemplary embodiment detects the activation signal at an H level (more specifically, when the activation signal rises from an L level to the H level), and outputs an inner activation signal that activates the inner circuits of the IC 20.

The activation circuit 40 uses the GND of the IC 20 as the GND, and uses the power source voltage VDD of the IC 20 as the power source. The activation circuit 40 may include any configuration unless it can implement the above described functions, and can receive a signal having an amplitude within a range that is equal to or more than the GND potential and is equal to or lower than the VDD potential.

The driving circuit 50 of the present exemplary embodiment outputs the activation signal, which activates the upper IC 20, to the activation circuit 40 of the upper IC 20 (to be described in detail below) based on the control signal input from the control circuit 26. The driving circuit 50 uses the power source voltage VDD of the IC 20 as the GND, and uses the boosted voltage HV output from the boosting circuit 32 of the IC 20 as the power source.

Figure 2A:
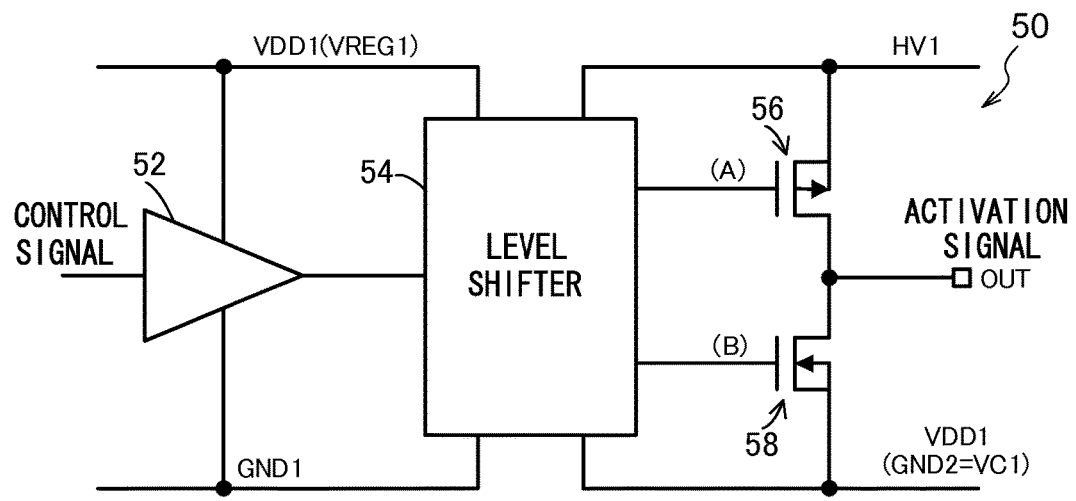
FIG. 2A is a diagram illustrating a driving circuit of the first exemplary embodiment.
Figure 2B:
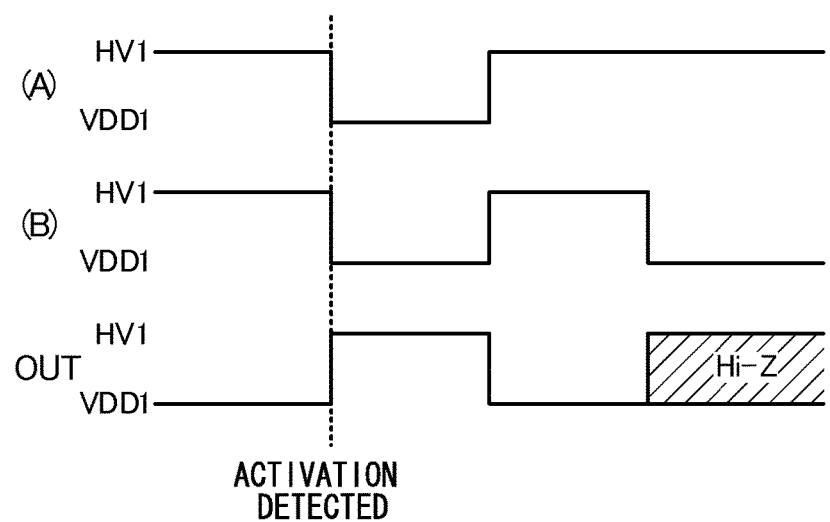
FIG. 2B is a timing chart illustrating a temporal variation of potentials at nodes (A) and (B), and an output terminal OUT.

FIGS. 2A and 2B illustrate a configuration of a specific example of the driving circuit 50 of the present exemplary embodiment. FIG. 2A is a diagram schematically illustrating a configuration of the driving circuit 50, FIG. 2B is a timing chart illustrating a temporal variation of potentials at nodes (A) and (B), and an output terminal OUT as an output terminal (more specifically, a signal flowing through the node (A), a signal flowing through the node (B), and a signal flowing through the output terminal OUT). FIGS. 2A and 2B illustrates the driving circuit $50_1$ of the IC $20_1$ for the convenience of description.

As illustrated in FIG. 2A, the driving circuit 50 of the present exemplary embodiment includes a buffer 52, a level shifter 54, a PMOS transistor 56, and an NMOS transistor 58.

The control circuit 26 outputs the control signal to the driving circuit 50 when a predetermined inner circuits of the IC 20 is activated. The control signal is input to the buffer 52 of the driving circuit 50. A signal output from the buffer 52 is input to the level shifter 54. A level shifter 54A converts a low voltage signal (having a potential level within a range that is equal to or more than the input GND1 potential and is equal to or lower than the VDD1 potential (VREG)) into a high voltage signal (having a potential level within a range that is equal to or more than the VDD1 potential and is equal to or lower than the HV1 potential), and outputs the converted signal. The output of the level shifter 54 is input to the PMOS transistor 56 through the node (A), and input to the NMOS transistor 58 through the node (B).

The gate terminal of the PMOS transistor 56 is connected to the level shifter 54 via the node (A). The source terminal of the PMOS transistor 56 is connected to the boosted voltage HV (specifically, a signal line for supplying the boosted voltage HV). The drain terminal of the PMOS transistor 56 is connected to the output terminal OUT and the drain terminal of the NMOS transistor 58. The gate terminal of the NMOS transistor 58 is connected to the level shifter 54 via the node (B). The source terminal of the NMOS transistor 58 is connected to the power source voltage VDD (specifically, a signal line for supplying the voltage VDD). The drain terminal of the NMOS transistor 58 is connected to the output terminal OUT and the drain terminal of the PMOS transistor 56. A signal output from the output terminal OUT is output as the activation signal to the activation circuit 40 of the upper IC 20.

Figure 3:
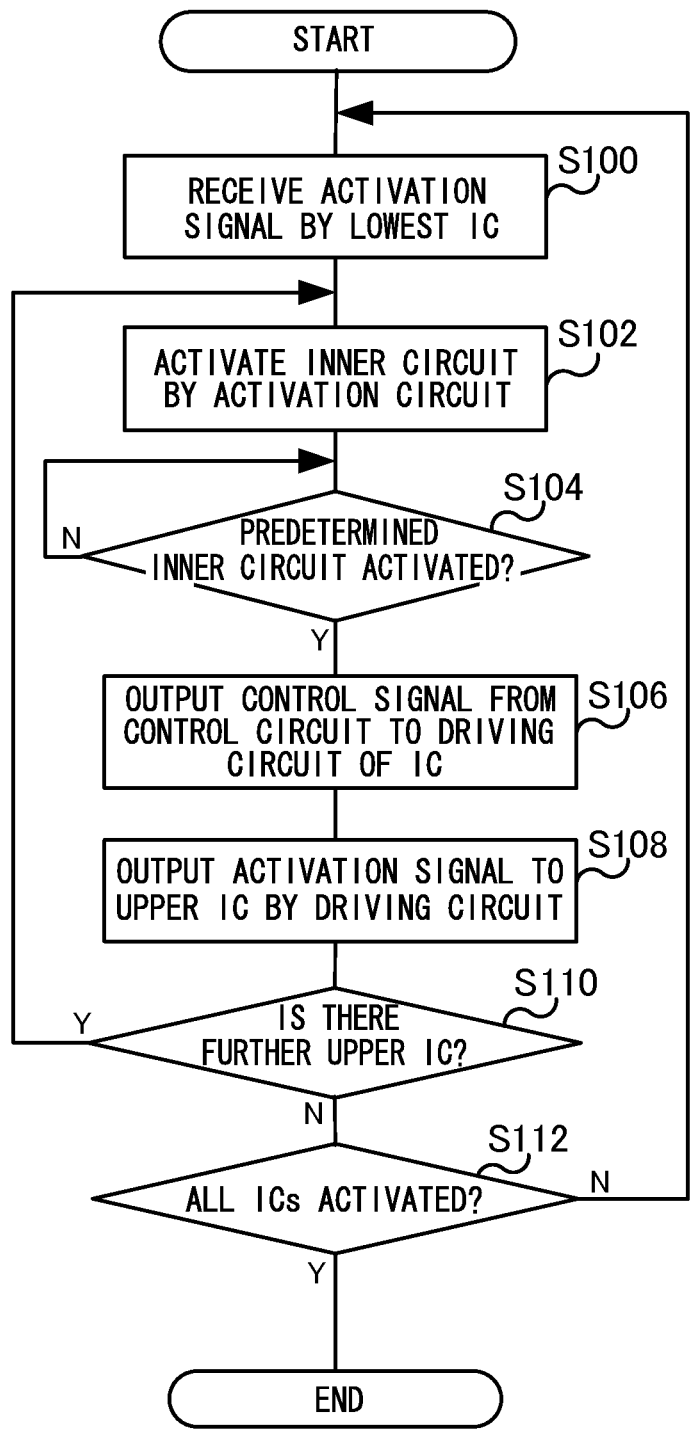
FIG. 3 is a flowchart illustrating a flow of an activation operation of each IC of the battery monitoring system of the first exemplary embodiment.

An activation operation of the IC 20 in the battery monitoring system 10 of the present exemplary embodiment will be described in detail based on a flow of the operation of the entire battery monitoring system 10. FIG. 3 is a flowchart illustrating a flow of an operation of the entire battery monitoring system 10. The activation operation illustrated in FIG. 3 is performed in a case in which power is supplied to the battery monitoring system 10 or a case in which the operation is recovered from the standby state. In the present exemplary embodiment, the "standby state" means that the IC is in a non-operation state for reducing current consumption in a case in which a predetermined condition is satisfied. In the IC 20 of the present exemplary embodiment, the inner circuits enter the standby state except the activation circuit 40, which is operated by the power source voltage VDD that is not disconnected even in the standby state. Accordingly, in the IC 20 of the present exemplary embodiment, the lower communication circuit 22, the upper communication circuit 24, the control circuit 26, the voltage measuring circuit 28, the regulator 30, the boosting circuit 32, and the driving circuit 50 enter the standby state.

First, in step S100, the lowest IC 20 receives the activation signal. In the battery monitoring system 10 of the present exemplary embodiment, the activation circuit $40_1$ of the IC $20_1$ receives the activation signal. In the battery monitoring system 10 of the present exemplary embodiment, the activation is performed from the lower IC 20 to the upper IC 20 in sequence, since the MCU 12 is connected to the lowest IC 20. Therefore, first, the lowest IC 20 receives the activation signal. The activation signal may be input from the MCU 12, from another circuit in the battery monitoring system 10, or from an external device.

Step S102 to step S108 are the processes performed in the IC 20 that has received the activation signal.

In step S102, the activation circuit 40 of the IC 20 that receives the activation signal activates the inner circuits of the IC 20. In the present exemplary embodiment, as an example, when the activation circuit 40 detects the activation caused by the activation signal, the activation circuit 40 outputs a signal indicating the detection of the activation to the regulator 30, and the regulator 30 is first activated. After the activation of the regulator 30, the inner circuits driven by the driving voltage VREG generated by the regulator 30 is activated, and enters to an operation state from a non-operation state. Accordingly, the control circuit 26 is also activated by the activation of the regulator 30. Further, the control circuit 26 activates the boosting circuit 32 and the driving circuit 50, and thus, the driving circuit 50 can output the activation signal to the upper IC 20.

In the next step S104, the IC 20 is in the standby state until predetermined inner circuits is activated and, when being activated, the process proceeds to step S106. In the present exemplary embodiment, the control circuit 26 of the IC 20 determines whether the predetermined inner circuits are activated. As described above, for example, predetermined inner circuits may be the control circuit 26, the regulator 30, and the boosting circuit 32. However, the present invention is not limited thereto. The predetermined inner circuits may be any inner circuits as long as they are related to the power supply necessary for the operating the driving circuit 50. As another example, the predetermined inner circuits may include all of the inner circuits of the IC 20.

As described above, in the present exemplary embodiment, at least the control circuit 26 and the boosting circuit 32 are activated when the regulator 30 is activated. However, the lower communication circuit 22, the upper communication circuit 24, and the voltage measuring circuit 28 may not be activated at this time, and may be activated in a case in which these circuits are actually required.

In a case in which the predetermined inner circuits are activated, in step S106, the control circuit 26 outputs a control signal indicating that the activation of the predetermined inner circuits are completed, to the driving circuit 50.

Note that, even when the upper communication circuit 24 of the IC 20 goes into the operation state, in the upper IC 20, the regulator 30 and the lower communication circuit 22 are in the non-operation state. Therefore, the upper communication circuit 24 does not perform the communication.

In next step S108, the driving circuit 50 of the IC 20 outputs to the upper IC 20 the activation signal for activating the upper IC 20.

As illustrated in FIG. 2B, when the potential at node (A) of the driving circuit 50 of the IC 20 is HV1 (H level), the PMOS transistor 56 enters an OFF state, and when the potential at node (B) is HV1, the NMOS transistor 58 enters an ON state. Accordingly, the potential of the output terminal OUT becomes VDD1 (the L level).

When the potential at node (A) of the driving circuit 50 of the IC 20 is VDD1, the PMOS transistor 56 enters the ON state, and when the potential at the node (B) is VDD1, the NMOS transistor 58 enters the OFF state. Accordingly, the potential of the output terminal OUT becomes HV1. In the IC 20 of the present exemplary embodiment, in a case in which the activation signal output from the output terminal OUT rises from the L level to the H level, the activation of the activation circuit 40 of the upper IC 20 is detected.

Although the activation signal is a signal having an amplitude within a range that is equal to or more than the VDD potential and is equal to or lower than the HV potential of the IC 20, the activation circuit 40 of the upper IC 20 can receive a signal within a range that is equal to or more than the GND potential and is equal to or lower than the VDD potential of the IC 20 (that is, a signal within a range that is equal to or more than the VDD potential of the lower IC 20 and is equal to or lower than the VDD×2 potential). Therefore, the activation signal can be received in the upper IC 20.

In the driving circuit 50 of the IC 20 of the present exemplary embodiment, after the activation signal is output to the activation circuit 40 of the upper IC 20, as illustrated in FIG. 2B, the PMOS transistor 56 enters the OFF state by setting the potential at node (A) to HV1, the potential at node (B) to VDD1, and the NMOS transistor 58 enters the OFF state so that the output terminal OUT enters Hi-Z (high impedance) state.

In the next step S110, in a case in which there is an upper IC 20, the process returns to step S102, and in a case in which there is no upper IC 20, the process proceeds to step S112. In the battery monitoring system 10 of the present exemplary embodiment, each ICs 20 which is not activated executes the steps S102 to S108 subsequently, until all the ICs 20 are activated. Namely, in the battery monitoring system 10 of the present exemplary embodiment, when the IC $20_1$ is activated, the upper IC $20_2$ performs the processes of steps S102 to S108, so that the IC $20_2$ is activated. Therefore, in a case in which there is a further upper IC 20, in step S110, the process returns to step S102.

The IC 20 of the present exemplary embodiment does not determine whether there is an upper IC 20. Therefore, in the battery monitoring system 10 of the present exemplary embodiment, it is determined that there is an upper IC 20 when a predetermined time has elapsed after the lowest IC 20 (IC $20_1$) receives the activation signal in the process of step S100, and the process proceeds to step S112.

In next step S112, the MCU 12 of the battery monitoring system 10 determines whether all the ICs 20 are activated. In the present exemplary embodiment, as a specific example for the MCU 12 to determine whether all the ICs 20 are activated, the MCU transmits a signal such as a data signal to the IC 20. In a case in which an inaccessible IC 20 is found out, the MCU outputs the activation signal again to the IC 20. In a case in which the activation signal is input again to the activated IC 20, since the driving circuit 50 in the IC 20 is activated by the regulator 30 already activated, the activation circuit 40 outputs a signal to the control circuit 26, and the control signal is output from the control circuit 26 to the driving circuit 50.

In a case in which the MCU 12 of the battery monitoring system 10 determines that all the ICs 20 are activated, the operation is ended.

As described above, each IC 20 of the battery monitoring system 10 of the present exemplary embodiment has the following features. The IC 20 includes the activation circuit 40 which uses the GND of the IC 20 as the GND and the power source voltage VDD of the IC 20 as the power source. The IC 20 includes the driving circuit 50 which uses the power source voltage VDD of the IC 20 as the GND and the boosted voltage HV output from the boosting circuit 32 of the IC 20 as the power source. In the IC 20 in the standby state, only the activation circuit is in the operation state, and other inner circuits are in the non-operation state. In a case in which the state is recovered from the standby state, the activation circuit 40 outputs a signal for the inner circuits of the device to enter the operation state based on the activation signal. When all the inner circuits enter the operation state, the driving circuit 50 outputs the activation signal for activating the inner circuits of the upper IC 20 to the activation circuit 40 of the upper IC 20.

In this way, in the IC 20 of the battery monitoring system 10 of the present exemplary embodiment, only the activation circuit 40 is operated in the standby state when power down. Accordingly, the present exemplary embodiment may reduce current consumption.

In the conventional IC, in a case in which the state is recovered from the standby state, the activation signal for activating each IC is transmitted from the lower IC to the upper IC. Therefore, in the standby state, there was a case in which the regulator, the lower communication circuit, and the upper communication circuit had to be operated. In particular, since the regulator uses the power source voltage, the regulator consumes a large amount of current. Accordingly, in the conventional IC, achieving low power consumption was prevented due to operation of the regulator prevented.

Further, in order to reduce current consumption in the standby state, there were conventional ICs that include a regulator for supplying the driving voltage in a normal operation, and a regulator for supplying the driving voltage lower than that in the normal operation in the standby state, and that operates the lower communication circuit and the upper communication circuit by the low driving voltage in the standby state. However, in such conventional IC, since the regulator, the lower communication circuit, and the upper communication circuit are in the operation state in the standby state, the current are consumed. When compared with the above conventional ICs, in the IC 20 of the present exemplary embodiment, only the activation circuit 40 is operated in the standby state as described above. Therefore, the IC 20 of the present exemplary embodiment may reduce current consumption in the standby state (at the time of power down), compared to the conventional IC.

Further, in the battery monitoring system 10 of the present exemplary embodiment, each IC 20 can be activated at the voltage level (mode) as described above.

Note that the configuration of the driving circuit 50 is not limited to that illustrated in FIGS. 2A and 2B as long as the boosted voltage HV output from the boosting circuit 32 of the IC 20 is used as the power source circuit of the driving circuit 50, and the activation signal is output based on the control signal. Other configurations of the driving circuit 50 will be described as modification examples.

Modification 1-1

Figure 4A:
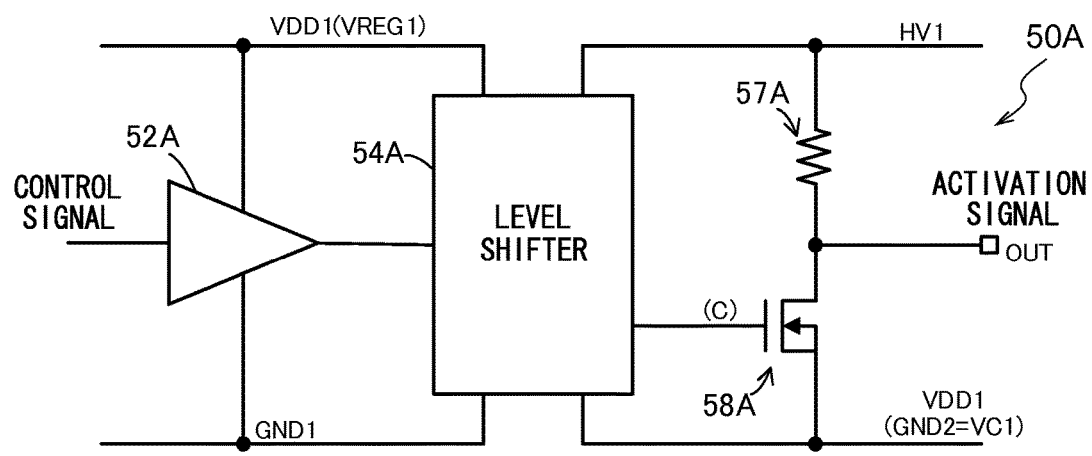
FIG. 4A is a diagram illustrating a configuration of a modification example 1-1 of the driving circuit.
Figure 4B:
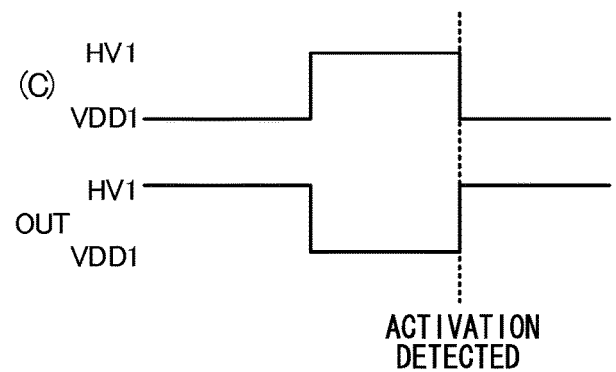
FIG. 4B is a timing chart illustrating a temporal variation of potential at nodes (A) and (B), and an output terminal OUT.

FIGS. 4A and 4B are diagrams illustrating a configuration of a driving circuit 50A as a modification example of the driving circuit 50. FIG. 4A is a diagram schematically illustrating the configuration of the driving circuit 50A, and FIG. 4B is a timing chart illustrating a temporal variation in voltage (the potential of a signal) at nodes (A) and (B) and the output terminal OUT. In FIG. 4A, a driving circuit $50A_1$ of the IC $20_1$ is illustrated for the convenience of description.

As illustrated in FIG. 4A, the driving circuit 50A of the present exemplary embodiment includes a buffer 52A, the level shifter 54A, a resistive element 57A, and an NMOS transistor 58A. In the above description, a case in which three-level buffer having three states is used as the driving circuit 50, as illustrated in FIGS. 2A and 2B, have been described. However, in the present modification example, a case in which an open drain buffer using an NMOS open drain is employed as the driving circuit 50A, is described.

The control signal is input to the buffer 52A of the driving circuit 50A. A signal output from the buffer 52A is input to the level shifter 54A. The level shifter 54A converts a low voltage signal having a potential level within a range that is equal to or more than the input GND1 potential and is equal to or lower than the VDD1 (VREG) potential, into a high voltage signal having a potential level within a range that is equal to or more than the VDD1 potential and is equal to or lower than the HV1 potential, and outputs the converted signal. The output of the level shifter 54A is input to the NMOS transistor 58A via node (C).

One end of the resistive element 57A is connected to the boosted voltage HV (specifically, a signal line for supplying the boosted voltage HV). The other end of the resistive element 57A is connected to the output terminal OUT and the drain terminal of the NMOS transistor 58A.

The gate terminal of the NMOS transistor 58A is connected to the level shifter 54A via node (C). The gate terminal of the NMOS transistor 58A is connected to the level shifter 54A via node (C). The source terminal of the NMOS transistor 58A is connected to the power source voltage VDD (specifically, a signal line for supplying the power source voltage VDD). The drain terminal of the NMOS transistor 58A is connected to the output terminal OUT and the other end of the resistive element 57A. A signal output from the output terminal OUT is output as the activation signal to the activation circuit 40 of the upper IC.

The activation operation of the IC 20 using the activation circuit 40 and the driving circuit 50A is the same as that described above (see FIG. 3), and therefore, the detailed description thereof will be omitted.

As illustrated in FIG. 4B, when the potential at node (C) of the driving circuit 50A is VDD1, the NMOS transistor 58A enters the OFF state, and the potential at the output terminal OUT becomes HV1 (the H level).

When the potential at node (C) of the driving circuit 50A is HV1, the NMOS transistor 58A enters the ON state, and the potential at the output terminal OUT becomes VDD1. In the present exemplary embodiment, in a case in which the activation signal output from the output terminal OUT rises from the L level to the H level, the upper activation circuit 40 detects the activation.

The activation signal toward the upper IC 20 is a signal having an amplitude within a range that is equal to or more than the VDD potential to the HV potential of the IC 20. The upper activation circuit 40 can receive a signal within a range that is equal to or more than the GND potential and is equal to or lower than the VDD potential of the IC 20 (that is, a signal within a range that is equal to or more than the VDD potential of the lower IC 20 and is equal to or lower than the VDD×2 potential or less). Accordingly, the upper activation circuit 40 can receive the activation signal.

Note that the resistive element 57A may not be provided in the driving circuit 50A, but instead, an external resistive element may be provided. In such case, the activation signal becomes a signal having an amplitude within a range that is equal to or more than the VDD1 potential and is equal to or lower than a pull-up voltage, based on the external resistive element.

Modification 1-2

Figure 5A:
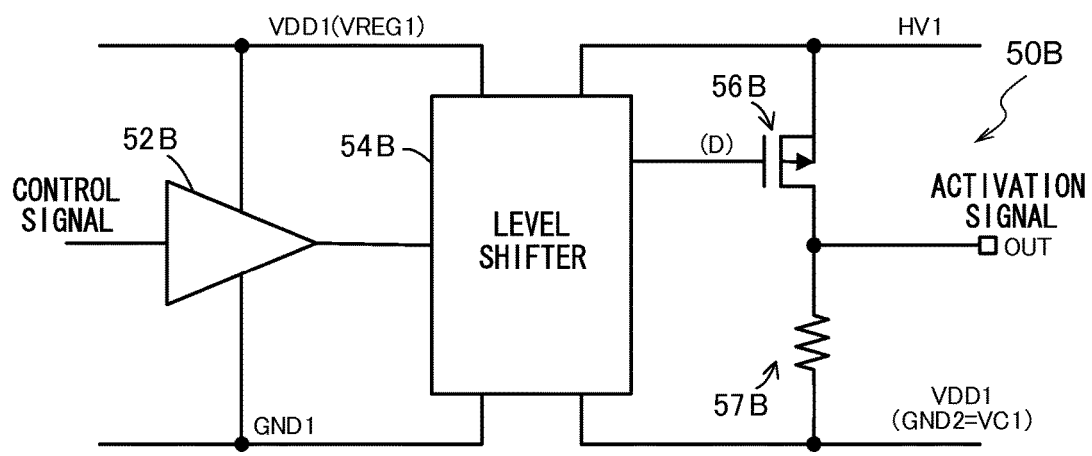
FIG. 5A is a diagram illustrating a configuration of a modification example 1-2 of the driving circuit.
Figure 5B:
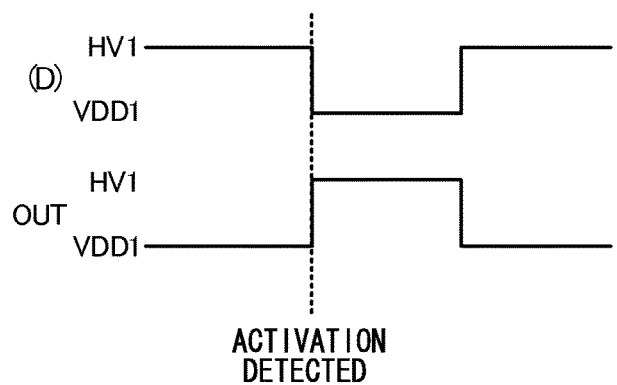
FIG. 5B is a timing chart illustrating a temporal variation of potential at node (D) and the output terminal OUT.

FIGS. 5A and 5B are diagrams illustrating a configuration of a driving circuit 50B, which a modification example of the driving circuit 50. FIG. 5A is a diagram schematically illustrating the configuration of the driving circuit 50B, and FIG. 5B is a timing chart illustrating a temporal variation of potential (the potential of a signal) at node (D) and the output terminal OUT. In FIG. 5A, a driving circuit $50B_1$ of the IC $20_1$ is illustrated for the convenience of description.

As illustrated in FIG. 5A, the driving circuit 50B of the present exemplary embodiment includes a buffer 52B, a level shifter 54B, a resistive element 57B, and a PMOS transistor 56B. In the driving circuit 50B of the present modification example, an open drain buffer that uses a PMOS open drain is employed.

The control signal is input to the buffer 52B of the driving circuit 50B. The signal output from the buffer 52B is input to the level shifter 54B. The level shifter 54B converts a low voltage signal, which has a potential level within a range that is equal to or more than the input GND1 potential and is equal to or lower than the VDD1 (VREG) potential, into a high voltage signal, which has a potential level within a range that is equal to or more than the VDD1 potential and is equal to or lower than the HV1 potential, and outputs the converted signal. The output of the level shifter 54B is input to the PMOS transistor 56B via node (D).

The gate terminal of the PMOS transistor 56B is connected to the level shifter 54B via node (D). The gate terminal of the PMOS transistor 56B is connected to a level shifter 54B via node (D). The source terminal of the PMOS transistor 56B is connected to a signal line for supplying the boosted voltage HV. The drain terminal of the PMOS transistor 56B is connected to the output terminal OUT and one end of the resistive element 57B. Further, the one end of the resistive element 57B is connected to the output terminal OUT and the drain terminal of the PMOS transistor 56B. The other end of the resistive element 57B is connected to a signal line for supplying the power source voltage VDD. The signal output from the output terminal OUT is output as the activation signal to the activation circuit 40 of the upper IC.

In the battery monitoring system 10, the activation operation of the IC 20 using the activation circuit 40 and the driving circuit 50B is the same as that described above (see FIGS. 4A and 4B), and therefore, detailed description thereof will be omitted.

As illustrated in FIG. 5B, when the potential at node (D) of the driving circuit 50B is HV1, the PMOS transistor 56B enters the OFF state, and the potential at the output terminal OUT becomes VDD1 (the L level).

When the potential at the node (C) of the driving circuit 50A is VDD1, the PMOS transistor 56B enters the ON state, and the potential at the output terminal OUT becomes HV1. In the present exemplary embodiment, in a case in which the activation signal output from the output terminal OUT rises from the L level to the H level, the upper activation circuit 40 detects the activation.

The activation signal for the upper IC 20 is a signal having an amplitude within a range that is equal to or more than the VDD potential and is equal to or lower than the HV potential of the IC 20. However, the upper activation circuit 40 can receive a signal within a range that is equal to or more than the GND potential and is equal to or lower than the VDD potential of the IC 20 (that is, a signal within a range that is equal to or more than the VDD potential of the lower IC 20 and is equal to or lower than the VDD×2 potential), and therefore, the upper activation circuit 40 can receive the activation signal.

Note that the resistive element 57B may not be provided in the driving circuit 50B, but instead, an external resistive element may be provided. In such case, the activation signal becomes a signal having an amplitude within a range that is equal to or more than the pull down voltage and is equal to or lower than the HV1 potential.

Modification 1-3

Figure 6A:
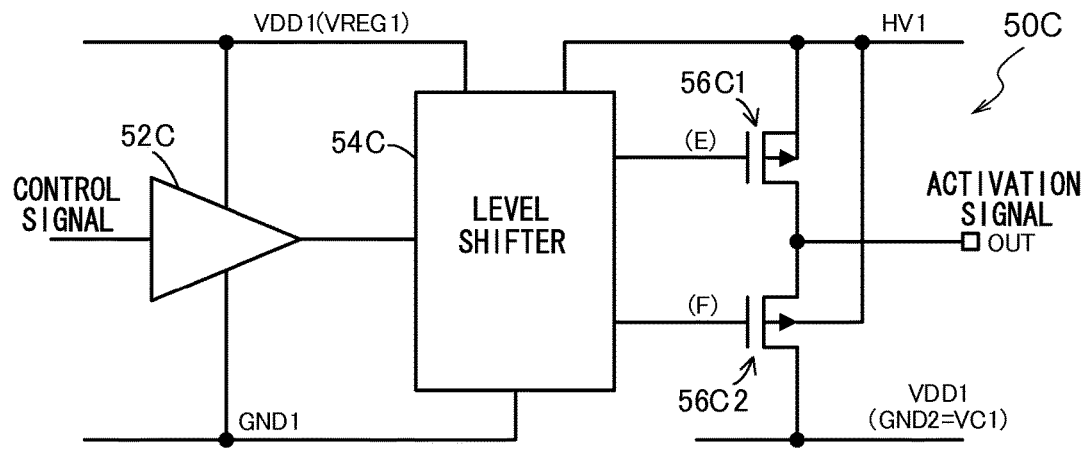
FIG. 6A is a diagram illustrating a configuration of a modification example 1-3 of the driving circuit.
Figure 6B:
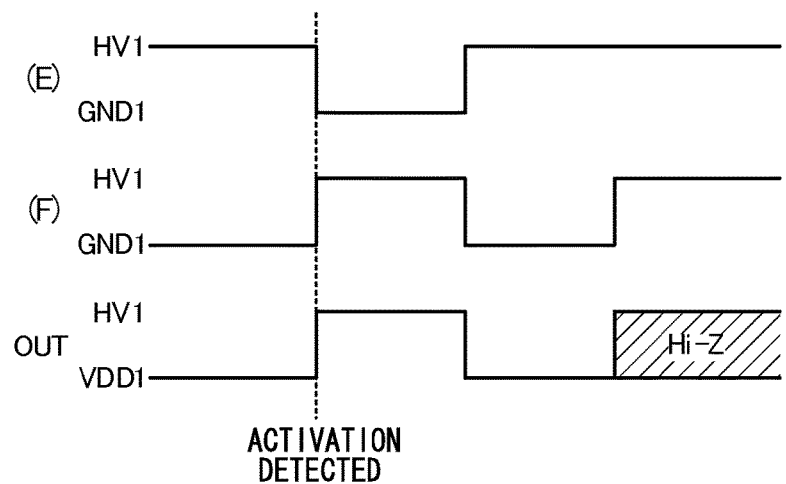
FIG. 6B is a timing chart illustrating a temporal variation of potential at nodes (E) and (F), and the output terminal OUT.

FIGS. 6A and 6B are diagrams illustrating a configuration of a driving circuit 50C, which is a modification example of the driving circuit 50. FIG. 6A is a diagram schematically illustrating the configuration of the driving circuit 50C, and FIG. 6B is a timing chart illustrating a temporal variation of potential (the potential of a signal) at nodes (E) and (F), and the output terminal OUT. In FIG. 6A, a driving circuit $50C_1$ of the IC $20_1$ is illustrated for the convenience of description.

As illustrated in FIG. 6A, the driving circuit 50C of the present exemplary embodiment includes a buffer 52C, a level shifter 54C, a PMOS transistor 56C1, and a PMOS transistor 56C2.

The control signal is input to the buffer 52C of the driving circuit 50C. The signal output from the buffer 52C is input to the level shifter 54C. The level shifter 54C converts a low voltage signal, which has a potential level within a range that is equal to or more than the input GND1 potential and is equal to or lower than the VDD1 (VREG) potential, into a high voltage signal, which has a potential level within a range that is equal to or more than the GND1 potential and is equal to or lower than the HV1 potential. The output of the level shifter 54C is input to the PMOS transistor 56C1 via node (E), and is input to the PMOS transistor 56C2 via node (F). In the activation operation, the potential at node (E) and the potential at node (F) are in inverse to each other.

The gate terminal of the PMOS transistor 56C1 is connected to the level shifter 54C via node (E). The source terminal of the PMOS transistor 56C1 is connected to a signal line for supplying the boosted voltage HV. The drain terminal of the PMOS transistor 56C1 is connected to the output terminal OUT and the drain terminal of the PMOS transistor 56C1. The gate terminal of the PMOS transistor 56C2 is connected to the level shifter 54C through the node (F). The source terminal of the PMOS transistor 56C2 is connected to the output terminal OUT and the drain terminal of the PMOS transistor 56C1. The drain terminal of the PMOS transistor 56C2 is connected to a signal line for supplying the voltage VDD. The back gate of the PMOS transistor 56C2 is connected to a signal line for supplying the boosted voltage HV. The signal output from the output terminal OUT is output as the activation signal to the activation circuit 40 of the upper IC.

As illustrated in FIG. 6B, in a case in which the potential at node (E) of the driving circuit 50C is HV1, and the potential at node (F) is GND1, the PMOS transistor 56C1 becomes Vgs=HV1−VDD1 and enters the OFF state. Further, the PMOS transistor 56C2 becomes Vgs=GND1−VDD1 and enters the ON state.

In a case in which the potential at node (E) of the driving circuit 50C is GND1, and the potential at node (F) is HV1, the PMOS transistor 56C1 becomes Vgs=GND1−HV1, and enters the ON state. Further, the PMOS transistor 56C2 becomes Vgs=HV1−HV1=0, and enters the OFF state. In the present exemplary embodiment, in a case in which the activation signal output from the output terminal OUT rises from the L level to the H level, the upper activation circuit 40 detects the activation.

The activation signal for the upper IC 20 is a signal having an amplitude within a range that is equal to or more than the VDD potential and is equal to or lower than the HV potential of the IC 20. However, the upper activation circuit 40 can receive a signal within a range that is equal to or more than the GND potential and is equal to or lower than the VDD of the IC 20 (that is, a signal within a range that is equal to or more than the VDD potential of the lower IC 20 and is equal to or lower than the VDD×2 potential), and therefore, the upper activation circuit 40 can receive the activation signal.

In the driving circuit 50C of the exemplary embodiment, after the activation signal is output to the upper activation circuit 40, the potentials at node (E) and node (F) become HV1 as illustrated in FIG. 6B, and the output terminal OUT is kept in the Hi-Z state.

In this way, in the present modification example, next stage (the stage following the level shifter 54C) includes the PMOS transistor only, and does not include the NMOS transistor. As in the driving circuit 50 illustrated in FIGS. 2A and 2B, in a case in which the next stage includes the PMOS transistor and the NMOS transistor 58, there is a need to set a bulk potential as the power source voltage VDD (the L level of the circuit) potential. In a case in which the driving circuit 50 is implemented using a process in which the NMOS transistor is not subjected to the well separation, the bulk potential has to be set as the GND potential. However, in such case, a variation of a threshold Vt may be caused due to a bias effect of a large substrate. Since the NMOS transistor is not employed in the driving circuit 50B illustrated in FIGS. 5A and 5B, the driving circuit may be implemented by using the process having no well separation of the NMOS, however, the L level (the power source voltage VDD) of the circuit is set according to the resistance of the resistive element 57B. In a case in which the resistance value is made to be high, transition of the level of the activation signal may be delayed, and thus a signal duty is degraded. In a case in which the resistance is low, current consumption may be increased when the activation signal is at H level (the boosted voltage HV). In this way, there is an inverse relation in the resistance value.

In this regard, in the present modification example, the next stage of the driving circuit 50 does not include the NMOS transistor and includes only the PMOS transistor. Therefore, the driving circuit 50 may be implemented using process having no well separation of the NMOS.

The H level (the boosted voltage HV) and the L level (the power source voltage VDD) of the activation signal both are driven (determined) by the PMOS transistor even without employing the resistive element or the like. Therefore, the present modification example may suppress a delay in the level transition speed of the activation signal, and the signal duty may be suppressed.

In the present modification example, the amplitude (the potential at node (E)) of a signal flowing through node (E)

is within a range that is equal to or more than the GND (GND1) potential and is equal to or lower than the HV (HV1) potential, similarly to the amplitude (the potential at the node (F)) of a signal flowing through node (F). However, the amplitude of a signal flowing through node (E) may be set differently from that of the node (F). For example, the signal may have an amplitude (a range that is equal to or more than the VDD potential and is equal to or lower than the HV potential) within a range that is equal to or more than the L level of the output of the driving circuit 50 and is equal to or lower than the H level (a range that is equal to or more than the VDD potential and is equal to or lower than the HV potential). The L level of a signal flowing through the node (F) may not be the GND1 potential. The L level of a signal flowing through the node (F) may be a voltage level lower than the power source voltage VDD1 by the threshold of the PMOS transistor 56C2.

Second Exemplary Embodiment

In the IC 20 of the present second exemplary embodiment, the description will be made about a case in which the activation circuit is different from the activation circuit 40 of the first exemplary embodiment. In the IC 20 (the battery monitoring system 10) of the present exemplary embodiment, the other circuit components, the operations thereof, and the like are the same as those of the first exemplary embodiment, and thus the detailed description thereof will be omitted.

Figure 7:
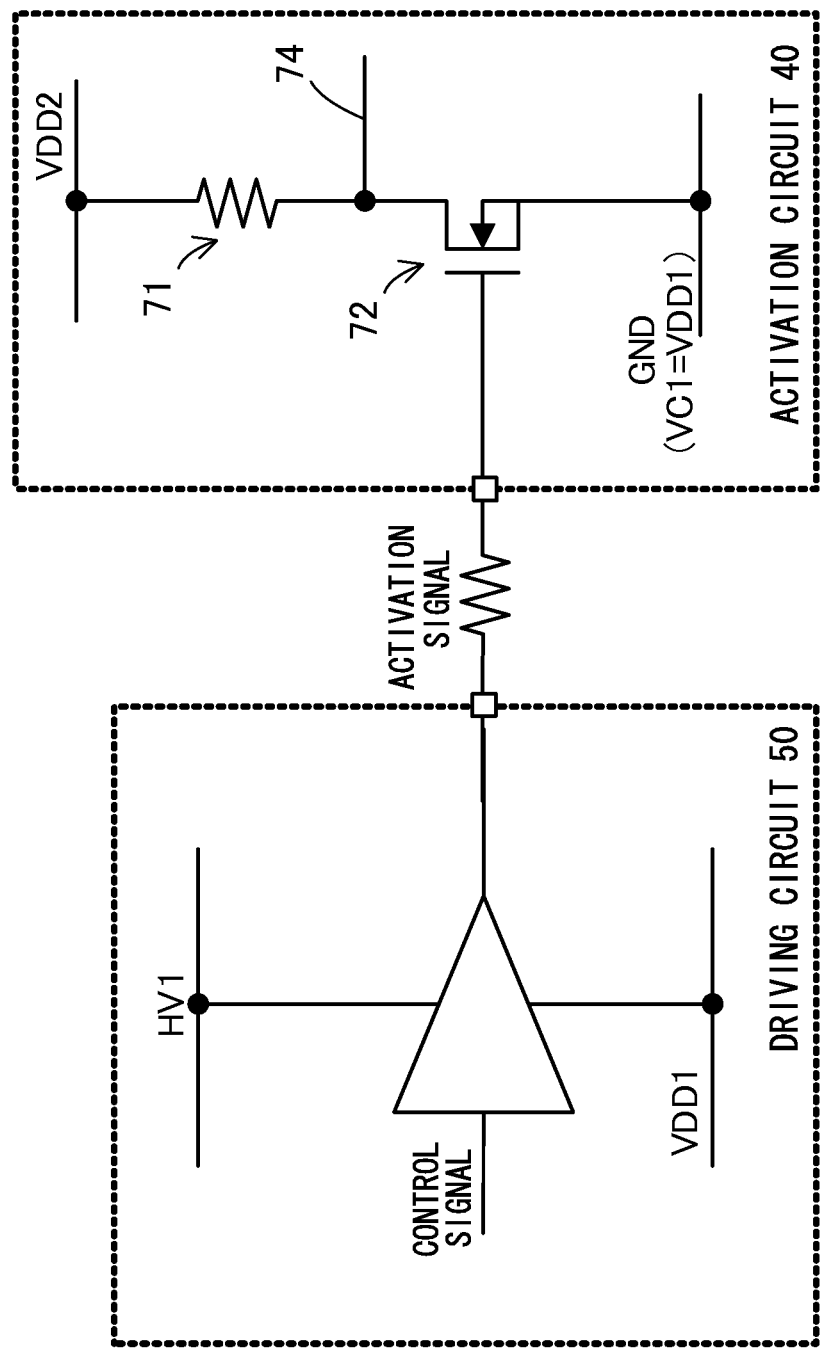
FIG. 7 is a diagram illustrating a configuration of a driving circuit and an activation circuit of the first exemplary embodiment.

FIG. 7 is a diagram illustrating a configuration of the activation circuit 40 used in the first exemplary embodiment. In FIG. 7, the driving circuit $50_1$ of the IC $20_1$ and the activation circuit $40_2$ of the IC $20_2$ are illustrated for the convenience of description.

The activation circuit 40 includes a resistive element 71 and an NMOS transistor 72. One end of the resistive element 71 is connected to a signal line for supplying the power source voltage VDD of the IC 20, and the other end is connected to a signal line 74 through which the signal is output.

The control terminal of the NMOS transistor 72 is connected to the driving circuit 50 of the lower IC 20, and the activation signal is input from the driving circuit 50 of the lower IC 20. The drain terminal of the NMOS transistor 72 is connected to the other end of the resistive element 71 and the signal line 74, and the source terminal is connected to a signal line for supplying the GND potential (the voltage VC1) of the IC 20.

As illustrated in FIG. 1, the battery monitoring system 10 includes the filter 16 between the battery 18 and each IC 20. Therefore, since each IC 20 receives the power source voltage VDD through the filter 16, it is insusceptible to influence of noises. In each IC 20, the boosted voltage HV generated by the boosting circuit 32 is boosted based on the power source voltage VDD according to the driving voltage VREG which is the output of the regulator 30. Accordingly, the boosted voltage HV is hardly influenced by noises. On the other hand, the voltage VC (VC1) which is the GND potential of the circuit is directly input to the IC 20 without passing through the filter 16. Accordingly, the voltage VC (VC1) may be easily effected by voltage fluctuation of the battery cell 19 and influence of noises.

In a case in which the activation signal output from the driving circuit 50 is at L level (VDD1), the activation signal at L level (VDD1) is input as a gate voltage to the control terminal of the NMOS transistor 72 of the activation circuit 40. Therefore, the NMOS transistor 72 is in the OFF state, and accordingly, the activation signal hardly receives the influence of noises, as described above. In contrast, as described above, the voltage VC1 of the signal line connected to the source terminal of the NMOS transistor 72 easily receives the influence of noises. In a case in which the gate voltage of the NMOS transistor 72 is kept at L level, and the potential of the voltage VC1 is reduced more than the threshold Vt of the NMOS transistor 72 due to influence of noises caused by voltage fluctuation of the buttery or the like occur, the NMOS transistor 72 enters the ON state in error, and the level of the signal output from the activation circuit 40 changes. Accordingly, in such case, the activation circuit 40 may erroneously detect the activation.

In this regard, the activation circuit of the present exemplary embodiment may suppress the erroneous detection of the activation even in a case in which the influence of noises is received, as described above.

Figure 8:
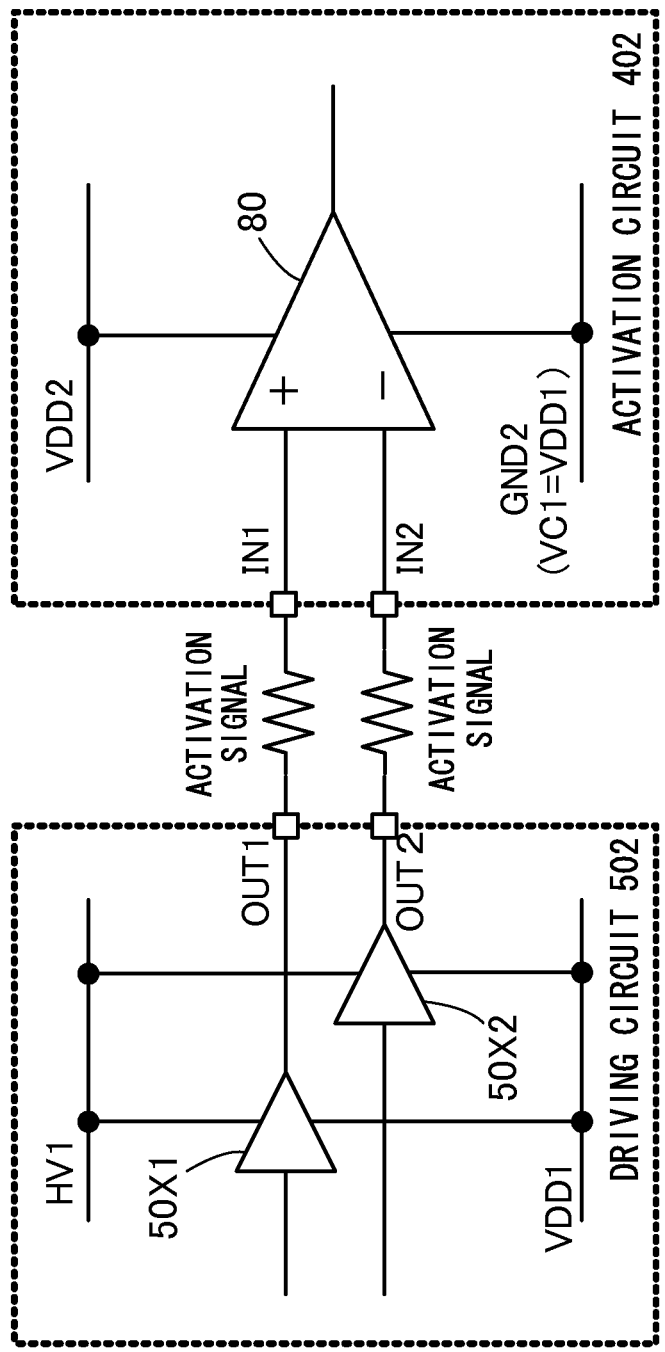
FIG. 8 is a diagram illustrating a configuration of a driving circuit and an activation circuit of a second exemplary embodiment.

FIG. 8 is a diagram illustrating a configuration of a driving circuit 502 and an activation circuit 402 of the present exemplary embodiment. In FIG. 8, the driving circuit $50_1$ of the IC $20_1$ and the activation circuit $40_2$ of the IC $20_2$ are illustrated for the convenience of description.

As illustrated in FIG. 8, in the present exemplary embodiment, the driving circuit 502 includes driving circuits 50X1 and 50X2 (hereinafter, referred to as "driving circuit 50X" when being referred collectively), and the activation signal is configured by a pair of complementary signals. Two driving circuits 50X included in the driving circuit 502 may be the same type, or may be any one of the driving circuits 50, 50A, 50B, and 50C of the first exemplary embodiment.

The activation circuit 402 includes a differential amplifier 80. The non-inverting input terminal of the differential amplifier 80 is connected to an input terminal IN1, and the activation signal is input from the driving circuit 50X1 via an output terminal OUT1. The inverting input terminal of the differential amplifier 80 is connected to an input terminal IN2, and the activation signal is input from the driving circuit 50X2 via an output terminal OUT2.

The activation circuit 402 detects the activation in a case in which the activation signal input to the non-inverting input terminal is at H level (the voltage HV1), and the activation signal input to the inverting input terminal is at L level (the power source voltage VDD1). In the activation circuit 402 of the present exemplary embodiment, the activation is detected in a case in which the activation signal input to the non-inverting input terminal is at L level (the power source voltage VDD1), and the activation signal input to the inverting input terminal is at H level (the voltage HV1).

As described above, the power source voltage VDD1 and the voltage HV1 hardly receive the influence of noises, and the activation circuit 402 detects the activation based on the levels of the power source voltage VDD1 and the voltage HV1. Accordingly, the activation circuit 402 may not erroneously detect the activation even in a case in which the voltage VC1 receives the influence of noises, as described above.

The configuration of the activation circuit 402 is not limited to that illustrated in FIG. 8, and any configuration may be employed as long as the activation circuit operates according to the activation signal that is a pair of complementary signals output form the IC 20 in the front stage. Other configurations of the activation circuit 402 will be specifically described as modification examples.

Modification 2-1

In the present modification example, the description will be made about a case in which a logical circuit is employed in the activation circuit.

Figures 9A, 9B:
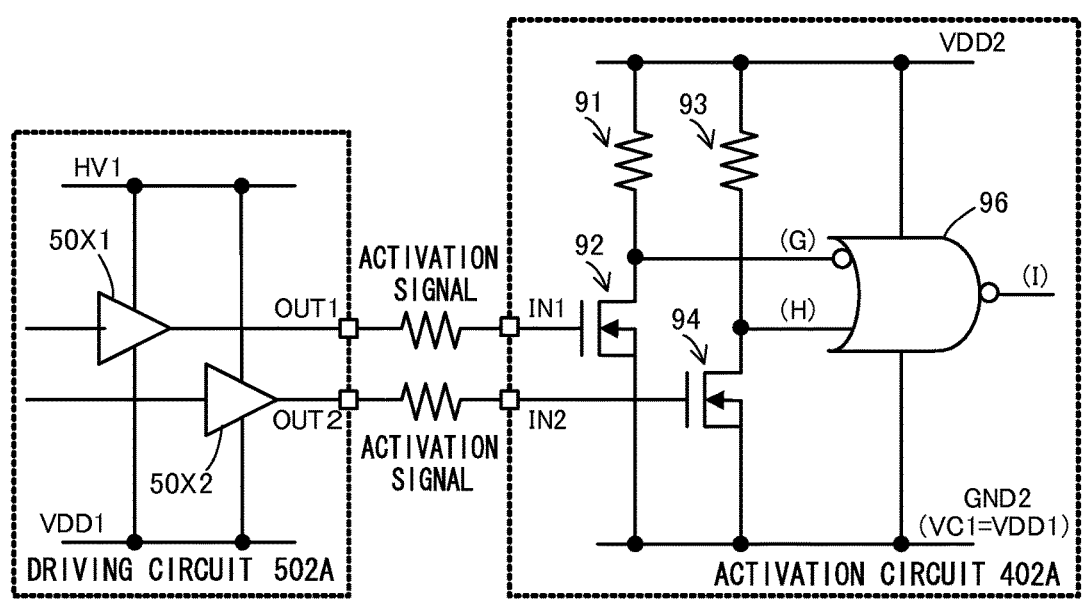
FIG. 9A is a diagram illustrating a configuration of a driving circuit and an activation circuit of a modification example.
FIG. 9B is a truth table of a logical circuit 96 of the activation circuit 402A.

FIGS. 9A and 9B are diagrams illustrating a driving circuit 502A and an activation circuit 402A of the present modification example. FIG. 9A is a diagram illustrating a configuration of the driving circuit 502A and the activation circuit 402A of the modification example, and FIG. 9B is a truth table of a logical circuit 96 of the activation circuit 402A. In FIG. 9A, a driving circuit $502_1$ of the IC $20_1$ and an activation circuit $402A_2$ of the IC $20_2$ are illustrated for the convenience of description.

The driving circuit 502A is the same as the driving circuit 502, and the description thereof will be omitted. On the other hand, as illustrated in FIG. 9A, in the modification example, the activation circuit 402A includes a resistive element 91, an NMOS transistor 92, a resistive element 93, an NMOS transistor 94, and the logical circuit 96.

One end of the resistive element 91 is connected to a signal line for supplying the power source voltage VDD2, and the other end is connected to the drain terminal of the NMOS transistor 92 and the inverting input terminal of the logical circuit 96 via node (G). The control terminal of the NMOS transistor 92 is connected to the input terminal IN1, and the activation signal is input from the driving circuit 50X1 through the output terminal OUT1. The drain terminal of the NMOS transistor 92 is connected to the other end of the resistive element 91 and the inverting input terminal of the logical circuit 96 via node (G). The source terminal of the NMOS transistor 92 is connected to a signal line for supplying the voltage GND2.

One end of the resistive element 93 is connected to a signal line for supplying the power source voltage VDD2, and the other end is connected to the drain terminal of the NMOS transistor 94 and the non-inverting input terminal of the logical circuit 96 via node (H). The control terminal of the NMOS transistor 94 is connected to the input terminal IN2, and the activation signal is input from the driving circuit 50X2 via the output terminal OUT2. The drain terminal of the NMOS transistor 94 is connected to the other end of the resistive element 93 and the non-inverting input terminal of the logical circuit 96 via node (H). The source terminal of the NMOS transistor 94 is connected to a signal line for supplying the voltage GND2.

The truth table of the logical circuit 96 is listed in FIG. 9B. The potential of a signal output from the logical circuit 96 and flowing through node (I) becomes the H level only in a case in which the potential of a signal flowing through node (G) is the H level and the potential of a signal flowing via node (H) is the L level.

The activation circuit 402A of the present modification example detects the activation in a case in which the activation signal input to the control terminal of the NMOS transistor 92 through the input terminal IN1 is at L level (the power source voltage VDD1), and the activation signal input to the control terminal of the NMOS transistor 94 through the input terminal IN2 is at H level (the voltage HV1). The logic of the logical circuit 96 may be rearranged such that the activation is detected in a case in which the activation signal input to the control terminal of the NMOS transistor 92 is at H level (the voltage HV1), and the activation signal input to the control terminal of the NMOS transistor 94 is at L level (the power source voltage VDD1).

In a state where the activation circuit 402A does not detect the activation, the NMOS transistor 92 enters the ON state when the activation signal input to the control terminal of the NMOS transistor 92 is at H level (the voltage HV1), and the NMOS transistor 94 enters the OFF state when the activation signal input to the control terminal of the NMOS transistor 94 is at L level (the power source voltage VDD1). This state corresponds to (G)=0, (H)=1, and (I)=0 in the truth table illustrated in FIG. 9B.

In a case in which the voltage VC1 is lowered by the threshold Vt or more of the NMOS transistors 92 and 94 in the above described state, the NMOS transistor 94 erroneously operates and enters in the ON state, similarly to the activation circuit 40 as illustrated in FIG. 7.

However, since the NMOS transistor 92 remains in the ON state, the state corresponds to (G)=0 and (H)=0 in the truth table illustrated in FIG. 9B, and the activation circuit 402A does not erroneously detect the activation due to (I)=0.

Accordingly, since the logical circuit is employed in the activation circuit, the activation circuit 402A of the present modification example may suppress the erroneous detection of the activation even in a case in which the noises occur.

In the activation circuit 402 (see FIG. 8), a constant current is required for the operation of the differential amplifier 80, but the constant current is not required in the present modification example, so that it is possible to reduce current consumption still more.

In the activation circuit 402A of the present modification example and the activation circuit 40 illustrated in FIG. 7, a case in which the NMOS transistor is employed has been described. However, the present invention is not limited thereto. The PMOS transistor may be employed instead of the NMOS transistor. In such case, the activation is detected in a case in which the activation signal at L level is input to the control terminal of the PMOS transistor of which the control terminal is connected to the input terminal IN1.

The activation circuits 40, 402, and 402A of the lowest IC 20 (the IC $20_1$) may be configured such that the potential of one input of a differential input circuit is fixed, and operates in a single phase. This is because the GND voltage is hardly influenced by noises, and thus the lowest IC 20 hardly erroneously operates even when the differential input circuit is not employed.

As described above, according to the IC 20 of the battery monitoring system 10 of each exemplary embodiment, the IC 20 includes the activation circuit 40, 402, or 402A which has the GND of the IC 20 as the GND of the circuit and has the power source voltage VDD of the IC 20 as the circuit power source. The IC 20 includes the driving circuit 50 or 502A which has the power source voltage VDD of the IC 20 as the GND of the circuit and has the boosted voltage HV output from the boosting circuit 32 of the IC 20 as the circuit power source. Therefore, only the activation circuits 40, 402, and 402A operated by the power source voltage VDD of the IC 20, which is not disconnected even in the standby state, are operated in the standby state. Accordingly, each of the exemplary embodiments may reduce current consumption in the standby state.

The number (the number of stages in the daisy-chain) of ICs or the like illustrated in the exemplary embodiments is an example, and is not particularly limited.

In each exemplary embodiment, the description has been made about a case in which the semiconductor device according to the invention is applied to the IC for monitoring the battery by measuring the voltage of the battery cell of the battery 18. However, the present invention is not limited thereto and may be applied to a device in which the power source voltage is supplied from the battery 18 in connection.

The configurations, the operations, and the like of the battery monitoring system 10, the IC 20, and the like described in each exemplary embodiment are given as an example, and various changes may be made according to situations within a scope not departing from the spirit of the present invention. Further, it is a matter of course that the respective exemplary embodiments may be implemented in combination.

What is claimed is:

1. A semiconductor device comprising:
an activation circuit, to which an activation signal output from an outside of the semiconductor device is input, that operates at an operation voltage within a range that is equal to or more than a ground potential of a connected external battery and is equal to or lower than a power source potential of the battery, and that outputs an inner activation signal based on the activation signal;
a regulator, to which the inner activation signal is input, that generates and outputs a driving voltage from the power source potential;
a boosting circuit, connected to the regulator, that generates and outputs a boosted voltage that is equal to or more than the driving voltage;
a driving circuit, connected to the boosting circuit, that operates at an operation voltage within a range that is equal to or more than the power source potential and is equal to or lower than a potential of the boosted voltage, and that outputs the activation signal to another semiconductor device according to the inner activation signal;
a first communication circuit, to which a first communication signal output from the outside is input, that operates at an operation voltage within a range that is equal to or more than the ground potential and is equal to or lower than a potential of the driving voltage, and that outputs an inner communication signal based on the first communication signal; and
a second communication circuit, to which the inner communication signal is input, that operates at an operation voltage within a range that is equal to or more than the power source potential and is equal to or lower than a potential of a driving voltage of the other semiconductor device, and that outputs a second communication signal based on the inner communication signal to the other semiconductor device,
wherein the driving circuit comprises
a level shifter that converts a potential of a signal according to the activation signal,
a PMOS transistor including a control terminal to which a first output of the level shifter is input, one terminal connected to a signal line through which the boosted voltage is supplied, and another terminal connected to an output terminal, and
an NMOS transistor including a control terminal to which a second output of the level shifter is input, one terminal connected to the another terminal of the PMOS transistor and the output terminal, and another terminal connected to a signal line through which the power source potential is supplied.

2. The semiconductor device according to claim 1, wherein:
the first communication circuit uses the ground potential as its ground, and uses the driving voltage as its power source;
the second communication circuit uses the power source potential as its ground, and uses a driving potential of the driving voltage of the other semiconductor device as its power source;
the activation circuit uses the ground potential as its ground, and uses the power source potential as its power source; and
the driving circuit uses the power source potential as its ground, and uses the potential of the boosted voltage as its power source.

3. A battery monitoring system comprising:
a battery including a plurality of battery cells connected in series;
a plurality of the semiconductor devices according to claim 1, wherein the semiconductor devices are supplied with a highest potential of the battery as the power source potential, are supplied with a lowest potential of the battery as the ground potential, and the first communication circuit and the second communication circuit are connected between the semiconductor devices; and
a control section that controls the plurality of semiconductor devices and is connected to any one of the plurality of semiconductor devices.

4. The battery monitoring system according to claim 3, wherein, subsequently from the semiconductor device to which the control section is connected, each of the plurality of semiconductor devices activates inner circuits disposed therein based on the activation signal, and outputs the activation signal from the driving circuit to a next semiconductor device after the activation.

5. A semiconductor device comprising:
an activation circuit, to which an activation signal output from an outside of the semiconductor device is input, that operates at an operation voltage within a range that is equal to or more than a ground potential of a connected external battery and is equal to or lower than a power source potential of the battery, and that outputs an inner activation signal based on the activation signal;
a regulator, to which the inner activation signal is input, that generates and outputs a driving voltage from the power source potential;
a boosting circuit, connected to the regulator, that generates and outputs a boosted voltage that is equal to or more than the driving voltage;
a driving circuit, connected to the boosting circuit, that operates at an operation voltage within a range that is equal to or more than the power source potential and is equal to or lower than a potential of the boosted voltage, and that outputs the activation signal to another semiconductor device according to the inner activation signal;
a first communication circuit, to which a first communication signal output from the outside is input, that operates at an operation voltage within a range that is equal to or more than the ground potential and is equal to or lower than a potential of the driving voltage, and that outputs an inner communication signal based on the first communication signal; and
a second communication circuit, to which the inner communication signal is input, that operates at an operation voltage within a range that is equal to or more than the power source potential and is equal to or lower than a potential of a driving voltage of the other semiconductor device, and that outputs a second communication signal based on the inner communication signal to the other semiconductor device,
wherein the driving circuit comprises
a level shifter that converts a potential of a signal according to the activation signal,
a first PMOS transistor including a control terminal to which a first output of the level shifter is input, one terminal connected to a signal line through which the boosted voltage is supplied, and another terminal connected to an output terminal; and a second PMOS transistor including a control terminal to which a second output of the level shifter is input, one terminal connected to the another terminal of the first PMOS transistor and the output terminal, and another terminal connected to a signal line through which the power source potential is supplied.

6. The semiconductor device according to claim 5, wherein:

the first communication circuit uses the ground potential as its ground, and uses the driving voltage as its power source;

the second communication circuit uses the power source potential as its ground, and uses a driving potential of the driving voltage of the other semiconductor device as its power source;

the activation circuit uses the ground potential as its ground, and uses the power source potential as its power source; and the driving circuit uses the power source potential as its ground, and uses the potential of the boosted voltage as its power source.

7. A battery monitoring system comprising:

a battery including a plurality of battery cells connected in series;

a plurality of the semiconductor devices according to claim 5, wherein the semiconductor devices are supplied with a highest potential of the battery as the power source potential, are supplied with a lowest potential of the battery as the ground potential, and the first communication circuit and the second communication circuit are connected between the semiconductor devices; and a control section that controls the plurality of semiconductor devices and is connected to any one of the plurality of semiconductor devices.

8. The battery monitoring system according to claim 7, wherein, subsequently from the semiconductor device to which the control section is connected, each of the plurality of semiconductor devices activates inner circuits disposed therein based on the activation signal, and outputs the activation signal from the driving circuit to a next semiconductor device after the activation.

9. A semiconductor device comprising:

an activation circuit, to which an activation signal output from an outside of the semiconductor device is input, that operates at an operation voltage within a range that is equal to or more than a ground potential of a connected external battery and is equal to or lower than a power source potential of the battery, and that outputs an inner activation signal based on the activation signal;

a regulator, to which the inner activation signal is input, that generates and outputs a driving voltage from the power source potential;

a boosting circuit, connected to the regulator, that generates and outputs a boosted voltage that is equal to or more than the driving voltage;

a driving circuit, connected to the boosting circuit, that operates at an operation voltage within a range that is equal to or more than the power source potential and is equal to or lower than a potential of the boosted voltage, and that outputs the activation signal to another semiconductor device according to the inner activation signal;

a first communication circuit, to which a first communication signal output from the outside is input, that operates at an operation voltage within a range that is equal to or more than the ground potential and is equal to or lower than a potential of the driving voltage, and that outputs an inner communication signal based on the first communication signal; and a second communication circuit, to which the inner communication signal is input, that operates at an operation voltage within a range that is equal to or more than the power source potential and is equal to or lower than a potential of a driving voltage of the other semiconductor device, and that outputs a second communication signal based on the inner communication signal to the other semiconductor device, wherein the driving circuit comprises a first driving circuit that outputs a first activation signal, and a second driving circuit that outputs a second activation signal that is in a complementary relationship with respect to the first activation signal, and wherein the activation circuit outputs the inner activation signal based on a potential difference between the first activation signal and the second activation signal.

10. The semiconductor device according to claim 9, wherein:

the first communication circuit uses the ground potential as its ground, and uses the driving voltage as its power source;

the second communication circuit uses the power source potential as its ground, and uses a driving potential of the driving voltage of the other semiconductor device as its power source;

the activation circuit uses the ground potential as its ground, and uses the power source potential as its power source; and the driving circuit uses the power source potential as its ground, and uses the potential of the boosted voltage as its power source.

11. A battery monitoring system comprising:

a battery including a plurality of battery cells connected in series;

a plurality of the semiconductor devices according to claim 9, wherein the semiconductor devices are supplied with a highest potential of the battery as the power source potential, are supplied with a lowest potential of the battery as the ground potential, and the first communication circuit and the second communication circuit are connected between the semiconductor devices; and a control section that controls the plurality of semiconductor devices and is connected to any one of the plurality of semiconductor devices.

12. The battery monitoring system according to claim 11, wherein, subsequently from the semiconductor device to which the control section is connected, each of the plurality of semiconductor devices activates inner circuits disposed therein based on the activation signal, and outputs the activation signal from the driving circuit to a next semiconductor device after the activation.

* * * * *